(12) United States Patent
Anda et al.

(10) Patent No.: US 6,548,838 B1
(45) Date of Patent: Apr. 15, 2003

(54) FIELD-EFFECT TRANSISTOR, BIPOLAR TRANSISTOR, AND METHODS OF FABRICATING THE SAME

(75) Inventors: Yoshiharu Anda, Osaka (JP); Mitsuru Nishitsuji, Osaka (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/666,157

(22) Filed: Sep. 19, 2000

(30) Foreign Application Priority Data

Sep. 20, 1999 (JP) .......................................... 11-265621

(51) Int. Cl.$^7$ .......................................... H01L 31/0328
(52) U.S. Cl. ...................................... 257/192; 257/197
(58) Field of Search ................................ 257/192, 197, 257/763

(56) References Cited

U.S. PATENT DOCUMENTS 5,001,534 A * 3/1991 Lunardi et al. ............. 257/197
5,508,535 A * 4/1996 Nakanishi .................... 257/192
6,310,368 B1 * 10/2001 Yagura ........................ 257/197

FOREIGN PATENT DOCUMENTS

JP          8-115924          5/1996

* cited by examiner

*Primary Examiner*—Mark V. Prenty
(74) *Attorney, Agent, or Firm*—Nixon Peabody LLP; Donald R. Studebaker

(57) ABSTRACT

A field-effect transistor of the present invention has first semiconductor layers disposed in at least two regions located above a substrate and spaced apart in a direction parallel to a substrate surface, second semiconductor layers disposed on the respective first semiconductor layers to protrude from the respective side surfaces of the first semiconductor layers, and ohmic electrodes disposed on the respective second semiconductor layers. The field-effect transistor also has a gate electrode formed by self alignment relative to the ohmic electrodes, which is disposed in a region located above the substrate and lying between the first semiconductor layers in spaced relation to the respective side surfaces of the first semiconductor layers.

8 Claims, 10 Drawing Sheets

FIELD-EFFECT TRANSISTOR, BIPOLAR TRANSISTOR, AND METHODS OF FABRICATING THE SAME

BACKGROUND OF THE INVENTION

The present invention relates to afield-effect transistor, a bipolar transistor, and methods of fabricating the same.

A typical mobile telephone has a transmit/receive switching device for switching a single antenna between transmission and reception. As the transmit/receive switching device, an RF switching device composed of a field-effect transistor (FET) using GaAs has been used, of which a reduction in loss has been demanded strongly.

To achieve a loss reduction in the RF switching device, it is necessary to reduce the source-to-drain resistance of the switching device in the on state and reduce the source-to-drain capacitance of the switching device in the off state.

Compared with the PDC (personal digital cellular) method standardized in Japan, the GSM (global system for mobile communication) method, which is a communication method standardized in European countries, features a large antenna output. To provide a large power handling capability even at a low control voltage, therefore, a multigate FET device in which one FET device has a plurality of gate electrodes should be used. However, since a conventional multigate FET device has a high on-state resistance, the insertion of the FET device causes a large insertion loss.

As an approach to the solution of the problem, the use of a FET device having a multigate electrode formed by self alignment as the RF switching device may be considered. By using the RF switching device having the self-aligned multigate electrode, the distance between the source and drain electrodes is reduced so that the source-to-drain resistance of the device in the on state is reduced. In addition, since the self-aligned gate of the FET device is formed by self alignment relative to the source and drain electrodes thereof, a mask placement error does not occur during the formation of the gate electrode by photolithography.

Of heterojunction bipolar transistors (HBTs) which are active devices different from FETs, the one having the base electrode formed by self alignment relative to the emitter electrode is effective in reducing the base resistance. In the case of the HBT device also, a mask placement error does not occur during the formation of the base electrode by photolithography, similarly to the aforesaid FET device having the gate electrode formed by self alignment.

A conventional FET device having a self-aligned gate electrode will be described with reference to the drawings.

FIG. 11 shows a cross-sectional structure in the direction of the gate length of the conventional FET device disclosed in Japanese Unexamined Patent Publication No. HEI 8-115924.

As shown in FIG. 11, a conductive layer (channel layer) 102 composed of n-type GaAs doped with silicon (Si) as an impurity and a Schottky layer 103 composed of undoped aluminum gallium arsenide (AlGaAs) are formed successively on a semi-insulating substrate 101 made of gallium arsenide (GaAs). An isolation region 104 as an insulated region is formed in the formed conductive layer 102 and Schottky layer 103 to reach the semi-insulating substrate 101 and electrically insulated from other devices (not shown).

A pair of contact layers 105 each composed of $n^+$-type indium gallium arsenide heavily doped with Si are formed on a region of the Schottky layer 103 on which the device is to be formed. Ohmic electrodes 106 each composed of a refractory metal such as tungsten silicide (WSi) and serving as a source or drain electrode are formed on the pair of contact layers 105, respectively.

On a region of the Schottky layer 103 lying between the contact layers 105, a gate electrode 107A is formed at a distance from the side surfaces of the contact layers 105. Metal layers 107B composed of the same material as composing the gate electrode 107A are formed on the respective ohmic electrodes 106. The entire surface of the FET device including the gate electrode 107A and the metal layers 107B is covered with a protective insulating film 108 composed of a silicon oxide or the like. On the portions of the protective insulating film 108 located above the respective metal layers 107B, there are disposed Au wiring layers 109 for electrical connection with the respective metal layers 107B.

A method of fabricating the FET device thus structured will be described herein below.

First, the conductive layer 102, the Schottky layer 103, and the contact layer 105 are epitaxially grown in succession on the semi-insulating substrate 101. Subsequently, a metal film composed of WSi for forming the ohmic electrodes is formed by sputtering over the entire surface of the contact layer 105.

Next, the metal film is patterned by reactive anisotropic dry etching by using, as a mask, a resist pattern formed by photolithography to have the ohmic electrode pattern, whereby the ohmic electrodes 106 composed of Wsi are formed.

Next, isotropic wet etching is performed with respect to the contact layer 105 by using a solution mixture of, e.g., phosphoric acid, aqueous hydrogen peroxide, and water, thereby removing the portion of the contact layer 105 corresponding to the gate electrode. Then, a specified amount of side etching is performed with respect to the portions of the contact layers 105 located under the ohmic electrodes 106, thereby forming each of the contact layers 105 into an undercut configuration relative to the ohmic electrodes 106.

Next, the isolation region 104 is formed in the peripheral portion of the FET device by ion implantation. Thereafter, a metal film for forming the gate electrode is vapor deposited to a thickness smaller than the film thickness of the contact layer 105 over the entire surface of the semi-insulating substrate 101, thereby forming the gate electrode 107A by self alignment relative to the ohmic electrodes 106.

Next, the protective insulating film 108 composed of the silicon oxide is formed over the entire surface of the semi-insulating substrate 101. After that, the Au wiring layers 109 are formed by plating in the contact portions of the protective insulating film 108 for contact with the ohmic electrodes 106.

If the FET device having the self-aligned gate electrode is to be used as the switching device, it is required to reduce the source-to-drain resistance of the switching device in the on state and reduce the source-to-drain capacitance of the switching device in the off state, as stated previously.

In reducing the off-state source-to-drain parasitic capacitance of the FET device having the gate electrode 107A formed by self alignment shown in FIG. 11, it is effective to reduce the area of each of the source and drain electrodes (ohmic electrodes 106) to the order of micrometers. By miniaturizing the source and drain electrodes, the chip size can be reduced drastically.

However, the conventional method of fabricating the field-effect transistor has the problem of an increase in contact resistance due to a reduction in contact area between each of the ohmic electrode 106 and the contact layer 105, which is caused by side etching (undercut) proceeding at the portions of the contact layers 105 underlying the ohmic electrodes 106 in the wet etching process performed with respect to the contact layers 105. If the ohmic electrode 106 with a width of 2.0 μm is etched by wet etching to a depth of 0.5 μm, e.g., the width of the portion of the contact layer 105 underlying the ohmic electrode 106 becomes 1 μm and the contact resistance is approximately doubled. This presents a new problem encountered by the ongoing miniaturization of the FET device having the self-aligned gate electrode.

To reduce the contact resistance, non-alloy electrodes which do not form alloy layers at the interfaces with the contact layers 105 and therefore do not require a heat treatment may be used as the ohmic electrodes 106. In the case of using a multilayer structure of, e.g., titanium (Ti), platinum (Pt), and gold (Au), which are named in order of increasing distance from the contact layer 105, the contact resistance of the non-alloy electrode is reduced by about an order of magnitude compared with the case of using WSi.

If the multilayer structure is etched by using a solution mixture of phosphoric acid, aqueous hydrogen peroxide, and water, the etching solution penetrates the interface between each of the contact layers 105 and the ohmic electrode 106 composed of the non-alloy electrode to etch the interface into a wedge-shaped configuration, so that the contact area between the contact layer 105 and the ohmic electrode 106 is reduced to disadvantageously increase the contact resistance. In the worst case, the ohmic electrode 106 peels off the contact layer 105.

Thus, the gate electrode 107A of the conventional FET device is formed by self alignment by utilizing the configuration of the contact layer 105 which is undercut relative to the ohmic electrode 106, i.e., by utilizing the configuration of the ohmic electrode 106 which is overhanging from the contact layer 105. As a consequence, the area of the contact layer 105 is inevitably smaller than the area of the ohmic electrode 106.

Similar problems are also encountered by the emitter electrode of the HBT device.

SUMMARY OF THE INVENTION

The present invention has been achieved to solve the foregoing conventional problems and it is therefore an object of the present invention to prevent, in a FET device having a self-aligned gate electrode or a HBT device having a self-aligned base electrode, an increase in contact resistance due to a reduction in the contact area between the electrode and a semiconductor layer.

To attain the object, the present invention provides a field-effect transistor wherein semiconductor layers each occupying an area nearly equal to the area occupied by the ohmic electrode are disposed between the contact layers and the ohmic electrodes each having an overhanging configuration protruding from the contact layer.

To attain the object, the present invention provides a bipolar transistor wherein a semiconductor layer occupying an area nearly equal to the area occupied by the emitter electrode is disposed between an emitter layer and the emitter electrode having an overhanging configuration protruding from the emitter layer.

Specifically, the field-effect transistor according to the present invention comprises: a substrate having a channel layer; first semiconductor layers disposed in at least two regions located above the channel layer and spaced apart in a direction parallel to a substrate surface; second semiconductor layers disposed on the respective first semiconductor layers to protrude from respective side surfaces of the first semiconductor layers; ohmic electrodes disposed on the respective second semiconductor layers; and a gate electrode disposed in a region located above the channel region and lying between the first semiconductor layers in spaced relation to the side surfaces of the first semiconductor layers.

Since the field-effect transistor according to the present invention has the second semiconductor layers disposed between the first semiconductor layers as the contact layers and the ohmic electrodes overlying the first semiconductor layers to protrude from the side surfaces of the first semiconductor layers, the second semiconductor layers and the ohmic electrodes have equal contact areas, so that the contact resistance between each of the ohmic electrodes and the second semiconductor layer is not increased even if the first semiconductor layers are reduced in size.

In the field-effect transistor of the present invention, each of the first semiconductor layers is preferably composed of gallium arsenide and each of the second semiconductor layers is preferably composed of indium gallium arsenide.

In the field-effect transistor of the present invention, each of the ohmic electrodes is preferably composed of a multilayer structure including a plurality of metal layers, of which the metal layer closer to the substrate preferably contains titanium.

A first method of fabricating the field-effect transistor according to the present invention comprises: successively forming a first semiconductor layer and a second semiconductor layer above a substrate having a channel layer; forming, on the second semiconductor layer, a mask pattern in an island configuration composed of at least two islands disposed at a distance; performing etching with respect to the second semiconductor layer masked with the mask pattern to pattern the second semiconductor layer into the island configuration; performing etching with respect to the first semiconductor layer masked with the second semiconductor layers in the island configuration such that the first semiconductor layer has the island configuration which is undercut relative to the second semiconductor layers; and, after removing the mask pattern, depositing a metal layer over an entire surface of the substrate including the second semiconductor layers in the island configuration to form a gate electrode by self alignment in a region located above the substrate and lying between the first semiconductor layers in the island configuration and form ohmic electrodes each composed of the metal layer.

Since the first method of fabricating the field-effect transistor performs etching with respect to the first semiconductor layer masked with the second semiconductor layers in the island configuration such that the first semiconductor layer has the undercut configuration relative to the second semiconductor layers, the second semiconductor layers and the metal layers formed on the second semiconductor layers by using the same mask pattern as used to pattern the second semiconductor layers protrude from the side surfaces of the first semiconductor layers. Accordingly, the second semiconductor layers and the metal layers serving as the ohmic electrodes have equal contact areas. Even if the first semiconductor layers are reduced in size, therefore, the contact resistance between each of the metal layers and the second semiconductor layer is not increased.

A second method of fabricating the field-effect transistor according to the present invention comprises: successively forming a first semiconductor layer, a second semiconductor layer, and a first metal layer above a substrate having a channel layer; forming, on the first metal layer, a mask pattern in an island configuration composed of at least two islands disposed at a distance; performing etching with respect to the first metal layer and second semiconductor layer masked with the mask pattern to pattern each of the first metal layer and second semiconductor layer into the island configuration; performing etching with respect to the first semiconductor layer masked with the second semiconductor layers in the island configuration such that the first semiconductor layer has the island configuration which is undercut relative to the second semiconductor layers; and, after removing the mask pattern, depositing a second metal layer over an entire surface of the substrate including the first metal layers in the island configuration to form a gate electrode by self alignment in a region located above the substrate and lying between the first semiconductor layers in the island configuration and form ohmic electrodes each composed of the first and second metal layers.

Besides achieving the same effects as achieved by the first method of fabricating the field-effect transistor, the second method of fabricating the field-effect transistor forms the ohmic electrodes from the first and second metal layers so that the film thickness of each of the ohmic electrodes is no more restricted by the film thickness of the second semiconductor layer forming the gate electrode. This increases process flexibility and reduces the resistance of each of the ohmic electrodes.

In the first or second method of fabricating the field-effect transistor, each of the first semiconductor layers is preferably composed of gallium arsenide and each of the second semiconductor layers is preferably composed of indium gallium arsenide.

In the first or second method of fabricating the field-effect transistor, each of the ohmic electrodes is preferably composed of a multilayer structure including a plurality of metal layers, of which the metal layer closer to the substrate preferably contains titanium.

In the first or second method of fabricating the field-effect transistor, the etching step performed with respect to the first semiconductor layer preferably includes the step of: performing wet etching using a solution mixture containing sodium citrate, aqueous hydrogen peroxide, and water.

In the first or second method of fabricating the field-effect transistor, the etching step performed with respect to the first semiconductor layer preferably includes the steps of: etching the first semiconductor layer in a direction perpendicular to the substrate surface by anisotropic selective dry etching; and etching the first semiconductor layer in a direction parallel to the substrate surface by isotropic selective dry etching.

The bipolar transistor according to the present invention comprises: a collector layer disposed above a substrate; a base layer disposed on the collector layer; a first semiconductor layer disposed above the base layer and a base electrode disposed in spaced relation to the first semiconductor layer; a second semiconductor layer disposed on the first semiconductor layer to protrude from side surfaces of the first semiconductor layer; and an emitter electrode disposed on the second semiconductor layer.

Since the bipolar transistor according to the present invention has the second semiconductor layer disposed between the first semiconductor layer disposed in overlying and spaced relation to the base layer and the emitter electrode overlying the first semiconductor layer to protrude from the side surfaces of the first semiconductor layer, the second semiconductor layer and the emitter electrode have equal contact areas. Even if the first semiconductor layer is reduced in size, therefore, the contact resistance between the emitter electrode and the second semiconductor layer is not increased.

In the bipolar transistor of the present invention, the first semiconductor layer is preferably composed of gallium arsenide and the second semiconductor layer is preferably composed of indium gallium arsenide.

In the bipolar transistor of the present invention, the emitter electrode is preferably composed of a multilayer structure including a plurality of metal layers, of which the metal layer closer to the substrate preferably contains titanium.

A first method of fabricating the bipolar transistor according to the present invention comprises: successively forming a base layer, a first semiconductor layer, and a second semiconductor layer above a substrate; forming a mask pattern in an island configuration on the second semiconductor layer and performing etching with respect to the second semiconductor layer masked with the formed mask pattern to pattern the second semiconductor layer into the island configuration; performing etching with respect to the first semiconductor layer masked with the second semiconductor layer in the island configuration such that the first semiconductor layer has the island configuration which is undercut relative to the second semiconductor layer; and after removing the mask pattern, depositing a metal layer over an entire surface of the base layer including the second semiconductor layer in the island configuration to form, on the base layer, a base electrode by self alignment in spaced and adjacent relation to the first semiconductor layer in the island configuration and form an emitter electrode composed of the metal layer.

Since the first method of fabricating the bipolar transistor performs etching with respect to the first semiconductor layer masked with the second semiconductor layer in the island configuration such that the first semiconductor layer has the undercut configuration relative to the second semiconductor layer, the second semiconductor layer is formed to protrude from the side surfaces of the first semiconductor layer. Accordingly, the second semiconductor layer and the metal layer serving as the emitter electrode have equal contact areas. Even if the first semiconductor layer is reduced in size, therefore, the contact resistance between the metal layer and the second semiconductor layer is not increased.

A second method of fabricating the bipolar transistor according to the present invention comprises: successively forming a base layer, a first semiconductor layer, a second semiconductor layer, and a first metal layer above a substrate; forming a mask pattern in an island configuration on the first metal layer and performing etching with respect to the first metal layer and second semiconductor layer masked with the formed mask pattern to pattern each of the first metal layer and second semiconductor layer into the island configuration; performing etching with respect to the first semiconductor layer masked with the second semiconductor layer in the island configuration such that the first semiconductor layer has the island configuration which is undercut relative to the second semiconductor layer; and after removing the mask pattern, depositing a second metal layer over an entire surface of the base layer including the first metal layer in the island configuration to form, on the base layer, a base electrode by self alignment in spaced and adjacent relation to the first semiconductor layer in the island configuration and form an emitter electrode composed of the second metal layer.

Besides achieving the same effects as achieved by the first method of fabricating the bipolar transistor, the second method of fabricating the bipolar transistor forms the emitter electrode from the first and second metal layers so that the film thickness of the emitter electrode is no more restricted by the film thickness of the second metal layer forming the base electrode. This increases process flexibility and reduces the resistance of the emitter electrode.

In the first or second method of fabricating the bipolar transistor, the first semiconductor layer is preferably composed of gallium arsenide and the second semiconductor layer is preferably composed of indium gallium arsenide.

In the first or second method of fabricating the bipolar transistor, the emitter electrode is preferably composed of a multilayer structure including a plurality of metal layers, of which the metal layer closer to the substrate preferably contains titanium.

In the first or second method of fabricating the bipolar transistor, the etching step performed with respect to the first semiconductor layer preferably includes the step of: performing wet etching using a solution mixture containing sodium citrate, aqueous hydrogen peroxide, and water.

In the first or second method of fabricating the bipolar transistor, the etching step performed with respect to the first semiconductor layer preferably includes the steps of: etching the first semiconductor layer in a direction perpendicular to the substrate surface by anisotropic selective dry etching; and etching the first semiconductor layer in a direction parallel to the substrate surface by isotropic selective dry etching.

DETAILED DESCRIPTION OF THE INVENTION

EMBODIMENT 1

A first embodiment of the present invention will be described with reference to the drawings.

Figure 1:
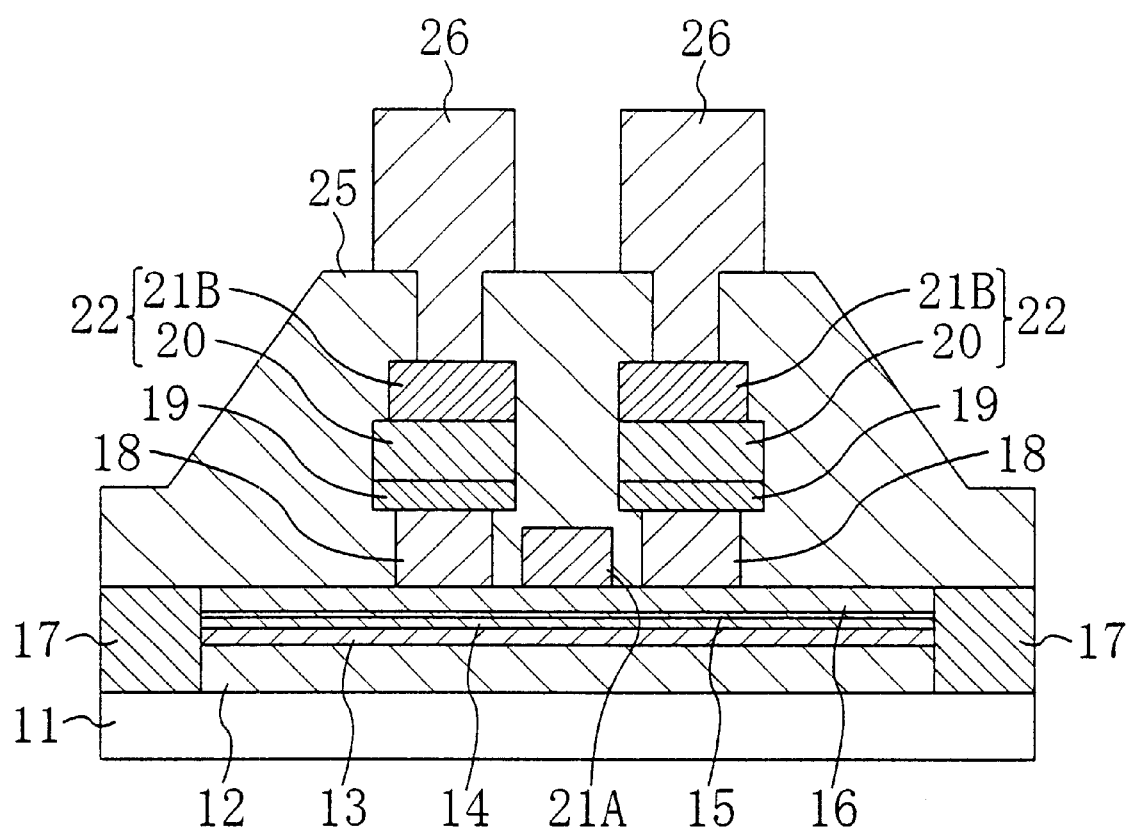
FIG. 1 shows a structural cross-sectional view in the direction of the gate length of a heterojunction field-effect transistor according to a first embodiment of the present invention, in which a gate electrode has been formed by self alignment relative to ohmic electrodes.

FIG. 1 shows a cross-sectional structure in the direction of the gate length of a heterojunction field-effect transistor according to the first embodiment of the present invention, in which a gate electrode has been formed by self alignment relative to ohmic electrodes.

As shown in FIG. 1, a buffer layer 12 composed of undoped gallium arsenide (GaAs) with a thickness of about 1 $\mu$m for reducing lattice misfit between a substrate 11 composed of semi-insulating GaAs and a crystal layer grown on the substrate 11, a channel layer 13 composed of undoped indium gallium arsenide ($In_{0.2}Ga_{0.8}As$) with a thickness of about 20 nm for permitting the flowing of carriers therethrough, a spacer layer 14 composed of undoped aluminum gallium arsenide ($Al_{0.25}Ga_{0.75}As$) with a thickness of about 5 nm, a carrier supplying layer 15 formed by planar doping only one atomic layer with Si ions as n-type impurity ions at a dose of about $5 \times 10^{12}$ $cm^{31\ 2}$, and a Schottky layer 16 composed of undoped aluminum gallium arsenide ($Al_{0.25}Ga_{0.75}As$) with a thickness of about 30 nm to make Schottky contact with a gate electrode formed thereon are formed successively by epitaxial growth on a principal surface of the substrate 11. An isolation region 17 as an insulated region is formed in the epitaxial layers to reach the substrate 11 and electrically insulated from other devices (not shown).

First contact layers 18 as first semiconductor layers each composed of $n^+$-type GaAs with a thickness of about 200 nm and second contact layers 19 as second semiconductor layers each composed of $n^+$-type InGaAs with a thickness of about 100 nm to make ohmic contact with a source or drain electrode are formed successively on the two island regions of the Schottky layer 16 which are configured as, e.g., squares and spaced apart along a surface of the substrate.

The side surfaces in the direction of the gate length of each of the second contact layers 19 has a so-called overhanging configuration which protrudes outwardly from the side surfaces of the first contact layer 18.

Lower ohmic electrodes 20 each serving as a source or drain electrode and composed of a multilayer structure (hereinafter referred to as a Ti/Pt/Au multilayer structure) of titanium (Ti), platinum (Pt), and gold (Au), which are named in order of increasing distance from the second contact layers 19, are formed on the respective second contact layers 19 to have contact areas nearly equal to the contact areas of the second contact layers 19.

On the region of the Schottky layer 16 lying between the first contact layers 18, a gate electrode 21A is formed by self alignment relative to the lower ohmic electrodes 20 by utilizing the configuration of each of the second contact layers 19 which is overhanging from the first contact layer 18.

Upper ohmic electrodes 21B each composed of the same multilayer structure as composing the gate electrode 21A are formed on the respective lower ohmic electrodes 20. The lower and upper ohmic electrodes 20 and 21B constitute ohmic electrodes 22.

Each of the ohmic electrodes 22 need not necessarily have a two-layer structure consisting of the upper and lower layers. It is sufficient for the ohmic electrode 22 to have either one of the upper and lower ohmic electrodes 21B and 20. If consideration is given to the self-aligned formation of the gate electrode 21A relative to the ohmic electrodes 22, however, single-layer ohmic electrodes 22 are preferably composed of the upper ohmic electrodes 21B having the same composition as the gate electrode 21A, as will be understood from the following description of the fabrication method.

The entire surface of the FET device including the ohmic electrodes 22 and the gate electrode 21A is covered with a protective insulating film 25 composed of a silicon nitride or silicon oxide. Wiring layers 26 for electrical connection with the respective ohmic electrodes 22 are disposed on the portions of the protective insulating film 25 located above the respective ohmic electrodes 22.

For a reduction in ohmic resistance, the metal film in contact with the second contact layers 19 is composed of titanium. For easier formation of the lower ohmic electrodes 20 composed of so-called non-alloy electrodes which are low in resistance and do not require a heat treatment for alloying, the n$^+$-type InGaAs is used as the material of the second contact layers 19.

A method of fabricating the field-effect transistor thus structured will be described with reference to the drawings.

FIGS. 2(a) to 2(c) through FIG. 5 illustrate the cross-sectional structures of the field-effect transistor according to the first embodiment in the individual process steps of the fabrication method therefor.

Figure 2A:
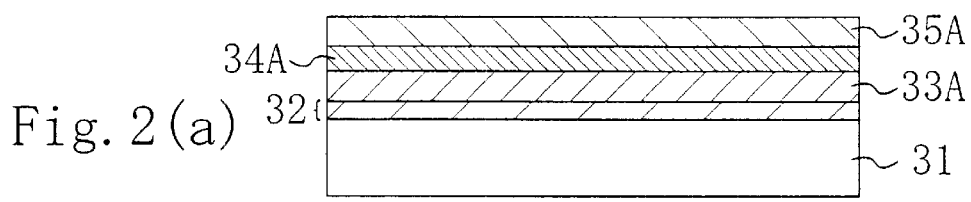
FIGS. 2(a) to 2(c) are structural cross-sectional views illustrating the process steps of a method of fabricating the field-effect transistor according to the first embodiment.

First, as shown in FIG. 2(a), the buffer layer composed of undoped GaAs with a thickness of about 1 μm, the channel layer composed of undoped $In_{0.2}Ga_{0.8}As$ with a thickness of about 20 nm, the spacer layer composed of undoped $Al_{0.25}Ga_{0.75}As$ with a thickness of about 5 nm, the n-type carrier supplying layer formed by planar doping only one atomic layer, and the Schottky layer composed of undoped $Al_{0.25}Ga_{0.75}As$ with a thickness of about 30 nm are grown successively on a substrate 31 composed of semi-insulating GaAs, whereby an epitaxial layer 32 as the active layer of the FET is formed. Subsequently, a first semiconductor layer 33A composed of n$^+$-type GaAs with a thickness of about 200 nm and a second semiconductor layer 34A composed of n$^+$-type InGaAs with a thickness of about 100 nm are grown on the epitaxial layer 32. Thereafter, a first metal layer 35A composed of the Ti/Pt/Au multilayer structure is formed by, e.g., EB vapor deposition on the second semiconductor layer 34A.

Figure 2B:
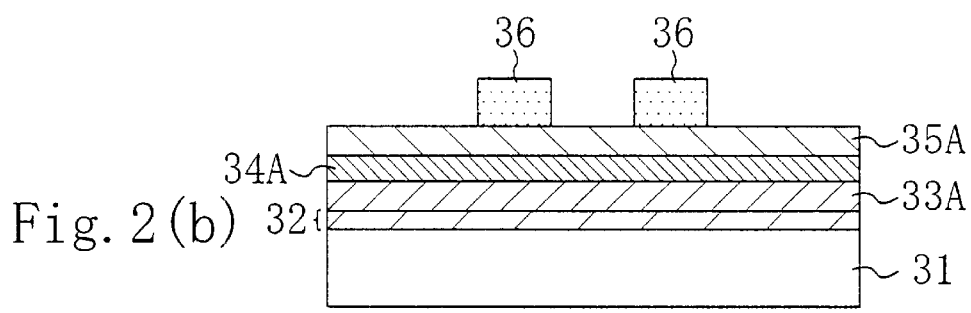

Next, as shown in FIG. 2(b), resist patterns 36 in a two-island configuration, which are disposed at a distance to provide a pattern for forming the source and drain electrodes, are formed by photolithography on the first metal layer 35A.

Figure 2C:
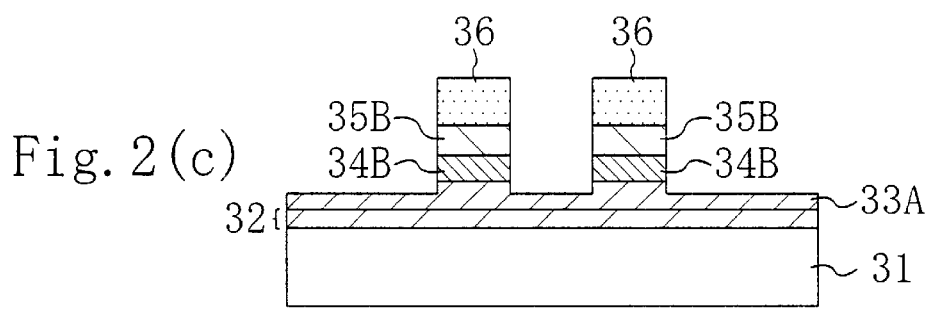

Next, as shown in FIG. 2(c), the first metal layer 35A and the second semiconductor layer 34A are etched by using, e.g., an ion milling process and using the resist pattern 36 as a mask, thereby forming second contact layers 34B from the second semiconductor layer 34A and forming lower ohmic electrodes 35B from the first metal layer 35A. Preferably, the ion milling process is completed at the time at which the upper portion of the first semiconductor layer 33A has been etched to a depth of about 10 nm to 30 nm.

Figure 3A:
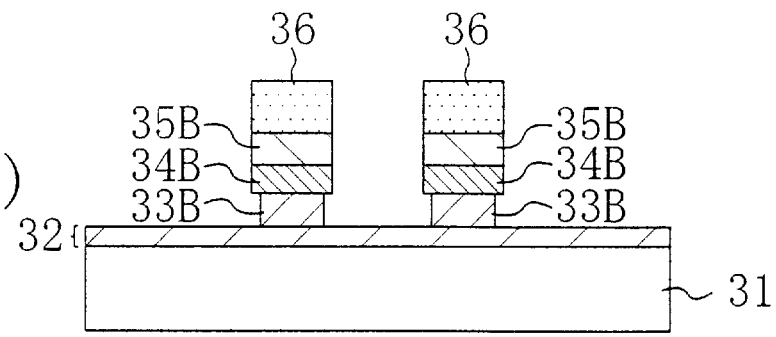
FIGS. 3(a) to 3(c) are structural cross-sectional views illustrating the process steps of the method of fabricating the field-effect transistor according to the first embodiment.

Next, as shown in FIG. 3(a), isotropic selective wet etching is performed with respect to the first semiconductor layer 33A by using an etching solution having an etching selectivity between the Schottky layer in the upper portion of the epitaxial layer 32 and the first semiconductor layer 33A and the second contact layer 34B and capable of etching the first semiconductor layer 33A, such as a solution mixture of sodium citrate, aqueous hydrogen peroxide, and water, thereby forming, from the first semiconductor layer 33A, first contact layers 33B each forming a heterojunction with the Schottky layer in the upper portion of the epitaxial layer 32. As a result of the isotropic etching, the side surfaces of the first contact layers 33B have undercut configurations relative to the side surfaces of the second contact layers 34B, so that the distance between the first contact layers 33B becomes larger than the distance between the second contact layers 34B.

In the etching step, a two-stage etching process consisting of anisotropic and isotropic etching steps are preferably performed by using a selective dry etching apparatus in accordance with, e.g., an inductively coupled plasam (ICP) method. This enables control over the aspect ratio of the width of an etched portion of the first semiconductor layer 33A to the depth thereof.

In a specific example of the two-stage etching process, the semiconductor layer 33A is etched by anisotropic selective dry etching in a direction perpendicular to a substrate surface in the first stage and then etched by isotropic selective dry etching in a direction parallel to the substrate surface in the second stage. As is well known, the anisotropic property of etching is enhanced if a bias voltage for plasma generation is adjusted relatively high.

Figure 3B:
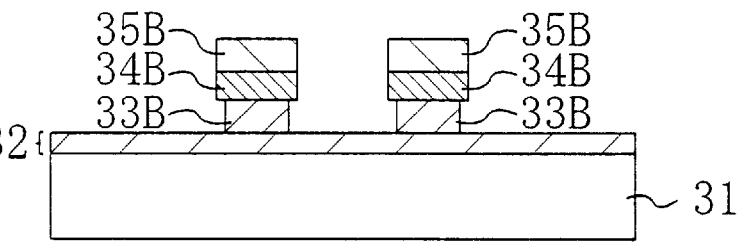
Figure 3C:
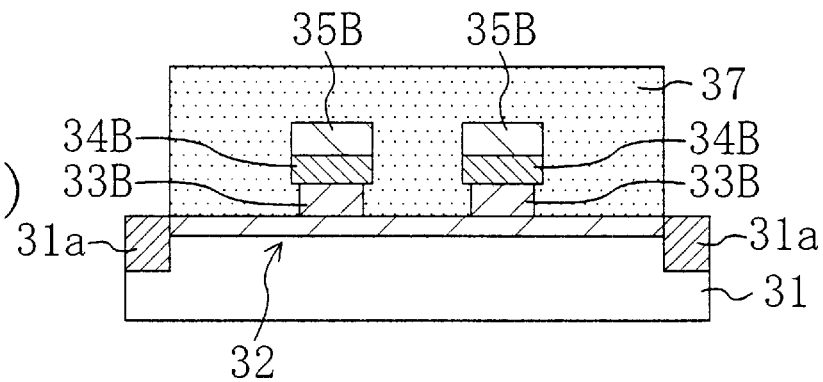

Next, as shown in FIG. 3(b), the resist patterns 36 are removed. Then, as shown in FIG. 3(c), a resist pattern 37 is formed on the substrate 31 to cover the region thereof on which the device is to be formed. Boron (B) ions or oxygen (O) ions are implanted into the substrate 31 masked with the formed resist pattern 37, whereby an isolation region 31a reaching the substrate 31 through the epitaxial layer 32 is formed. Instead of ion implantation, mesa etching may also be performed with respect to the isolation region 31a to isolate the devices.

Figure 4A:
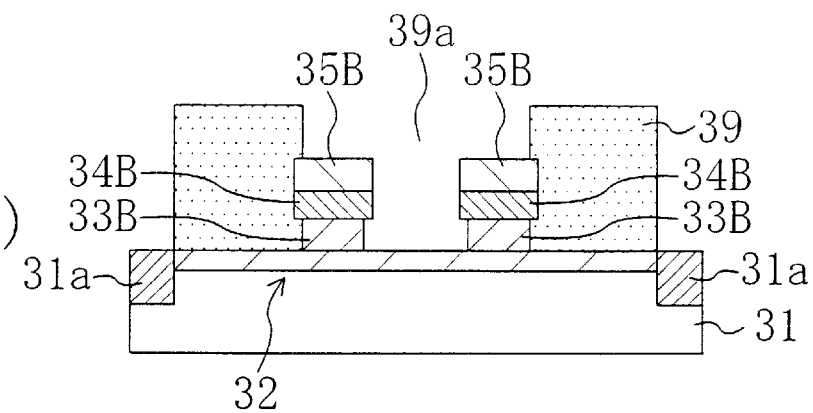
FIGS. 4(a) to 4(c) are structural cross-sectional views illustrating the process steps of the method of fabricating the field-effect transistor according to the first embodiment.

Next, the resist pattern 37 is removed and then, as shown in FIG. 4(a), a resist pattern 39 having an opening 39a in the region of the principal surface of the substrate 31 located between the lower ohmic electrodes 35B and between the first contact layers 33B is formed.

Figure 4B:
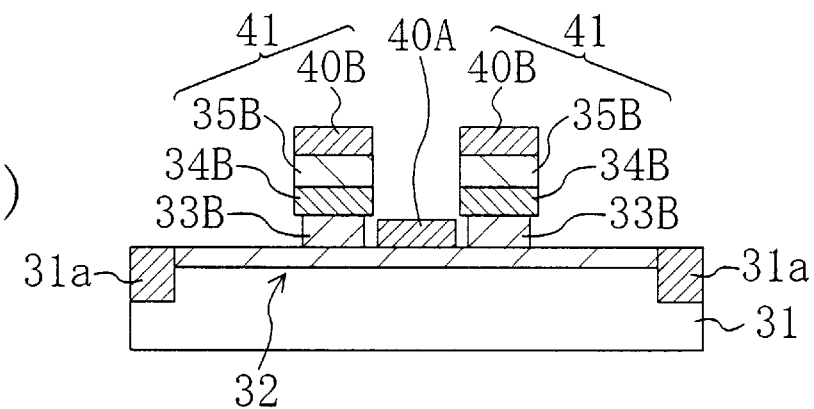

Next, a second metal layer composed of the Ti/Pt/Au multilayer structure is vapor deposited over the entire surface and then the resist pattern 39 is lifted off, whereby a gate electrode 40A composed of the second metal layer is formed by self alignment relative to the lower ohmic electrodes 35B and the second contact layers 34B on the region of the Schottky layer of the epitaxial layer 32 lying between the first contact layers 33B, as shown in FIG. 4(b). Consequently, upper ohmic electrodes 40B composed of the second metal layer are formed on the respective lower ohmic electrodes 35B. The lower ohmic electrodes 35B and the upper ohmic electrodes 40B constitute ohmic electrodes 41.

Figure 4C:
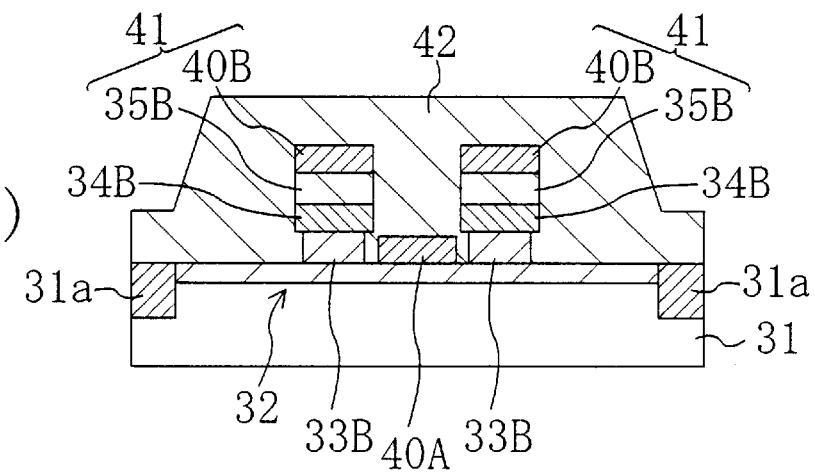

Next, as shown in FIG. 4(c), a protective insulating film 42 composed of a silicon nitride or silicon oxide is formed by plasma CVD over the entire surface of the substrate 31 to cover the ohmic electrodes 41 and the gate electrode 40A.

Figure 5:
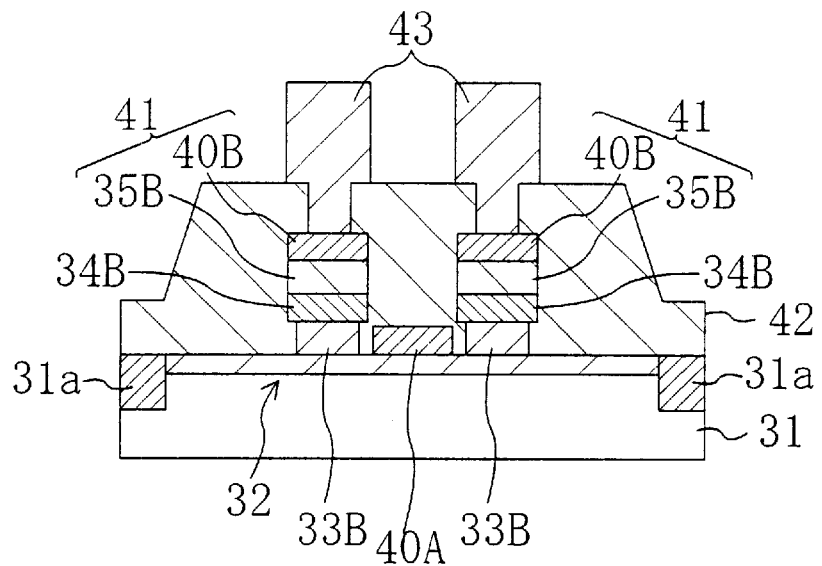
FIG. 5 is a structural cross-sectional view illustrating the process step of the method of fabricating the field-effect transistor according to the first embodiment.

Next, as shown in FIG. 5, contact holes are formed by photolithography in the respective portions of the protective insulating film 42 located above the ohmic electrodes 41. Thereafter, wiring layers 43 composed of Au are formed by, e.g., plating to fill in the formed contact holes, whereby the field-effect transistor according to the first embodiment is implemented.

Even if the first metal layer 35A is not vapor deposited on the second semiconductor layer 34A in the film forming step shown in FIG. 2(a), the field-effect transistor according to the present embodiment can be formed. This allows the gate electrode 40A and the ohmic electrodes 41 to be formed of the second metal layer as a single layer so that the fabrication process steps are reduced.

If each of the ohmic electrode 41 has a single-layer structure, however, it is necessary to adjust the film thickness of the gate electrode 40A smaller than the film thickness of each of the first contact layers 33B to prevent contact between the second contact layers 34B and the gate electrode 40A. By forming the ohmic electrodes 41 each having a two-layer structure, the thickness of each of the ohmic electrodes 41 is no more restricted by the gate electrode 40A, which increases process flexibility and achieves a further reduction in the resistance of the ohmic electrode 41.

Thus, according to the present embodiment, the second contact layers 34B each composed of InGaAs and formed to protrude from the side surfaces of the first contact layer 33B and have a contact area nearly equal to the contact area of each of the lower ohmic electrodes 35B are disposed between the first contact layers 33B each composed of GaAs and the lower ohmic electrodes 35B each composed of the Ti/Pt/Au multilayer structure. This achieves a sufficient reduction in the contact resistance between each of the lower ohmic electrodes 35B and the second contact layer 34B. Even if the field-effect transistor having the self-aligned gate electrode 40A is miniaturized such that the gate length becomes 1 µm or less, therefore, an increase in the contact resistance between the lower ohmic electrode 35B and the second contact layer 34B can be suppressed.

When each of the first contact layers 33B is etched selectively in the wet etching step shown in FIG. 3(a), moreover, the interface between the second contact layer 34B and the first contact layer 33B, which is the interface between the semiconductor layers, is prevented from being etched into a wedge-shaped configuration.

Since the semiconductor materials having an etching selectivity between the first and second semiconductor layer 33A and 34A have been used, the amount of overhanging of the second semiconductor layer from the first semiconductor layer can be controlled independently by performing isotropic etching with respect to the first semiconductor layer 33A after performing ion milling or anisotropic dry etching with respect to at least the first metal layer 35A and the second semiconductor layer 34A. In addition, each of the lower ohmic electrodes 35B has a contact area nearly equal to the contact area of the second contact layer 34B as a result of performing the first anisotropic etching process.

If the film thickness of the second semiconductor layer 34A is adjusted to about 200 nm to prevent physical etching damage to the substrate 31 by ion milling or anisotropic dry etching, damage to the epitaxial layer 32 can be reduced.

The first anisotropic etching process is preferably performed with respect to the Ti/Pt/Au multilayer structure used to form the first metal layer 35A into the non-alloy ohmic electrodes with a low resistance since the first anisotropic etching process renders the multilayer structure less likely to peel off the second semiconductor layer 34A.

The discontinuity between the energy level in the lower end portion of the conduction band of the first semiconductor layer 33A composed of GaAs and that of the second semiconductor layer 34A composed of InGaAs can be reduced by adjusting the composition of In in the portion of the second semiconductor layer 34A closer to the interface with the first semiconductor layer 33A to be lower than in the portion thereof closer to the interface with the first metal layer 35A.

In the case where a refractory metal such as tungsten silicide (WSi) or tungsten silicide nitride (WSiN) is used as the first metal layer 35A instead of the Ti/Pt/Au multilayer structure, the first metal layer 35A can be patterned by reactive anisotropic dry etching and the second semiconductor layer 34A can be patterned by anisotropic dry etching.

The second contact layer 34B may also be formed by preliminarily forming the lower ohmic electrodes 35B from the first metal layer 35A and performing dry etching using the lower ohmic electrodes 35B formed as a mask.

VARIATION OF EMBODIMENT 1

Figure 6:
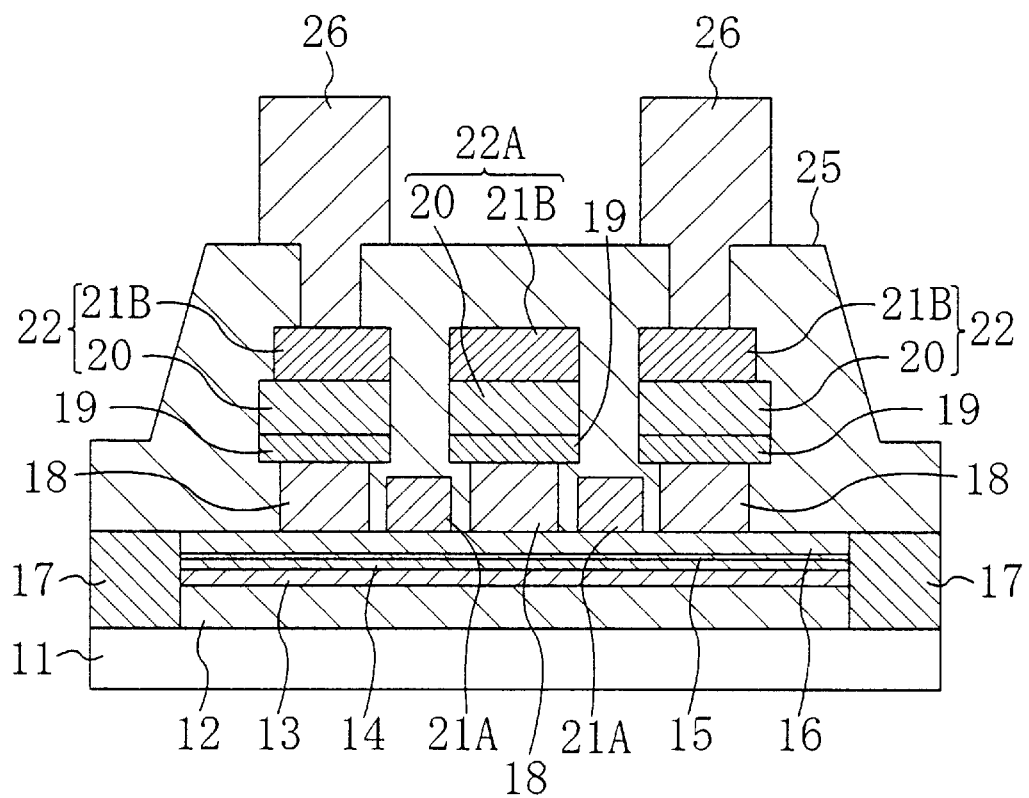
FIG. 6 is a structural cross-sectional view in the direction of the gate length of a heterojunction field-effect transistor according to a variation of the first embodiment of the present invention, in which a plurality of gate electrodes have been formed by self alignment relative to ohmic electrodes.

FIG. 6 shows a cross-sectional structure of a field-effect transistor according to a variation of the first embodiment of the present invention. In FIG. 6, the description of the same components as shown in FIG. 1 will be omitted by retaining the same reference numerals.

As shown in FIG. 6, a floating ohmic electrode 22A which has the same structure as each of the ohmic electrodes 22 and to which a voltage is not applied from the outside is disposed in a region located above the substrate 11 and lying between the two ohmic electrodes 22 connected to the wiring layers 26. This allows a multigate FET device having two or more gate electrodes 21A to be formed by self alignment relative to the ohmic electrodes 22 and the floating ohmic electrode 22A.

Since the region of the Schottky layer 16 located under the floating ohmic electrode 22A is covered with the first contact layer 18, a depletion phenomenon does not occur in the surface of the Schottky layer 16 so that the on-state resistance is reduced compared with the case where the floating ohmic electrode 22A is not provided.

EMBODIMENT 2

A second embodiment of the present invention will be described with reference to the drawings.

Figure 7:
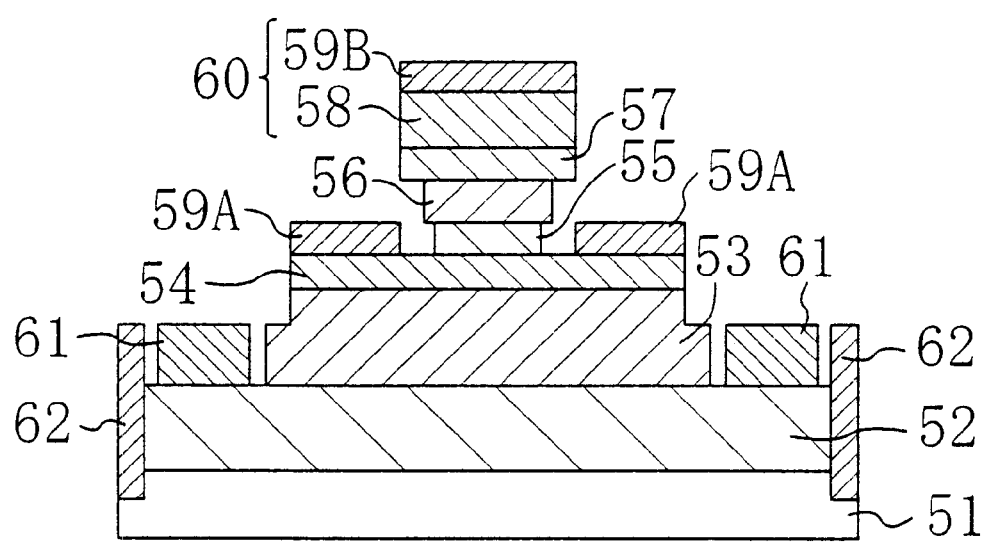
FIG. 7 is a structural cross-sectional view of a heterojunction bipolar transistor according to a second embodiment of the present invention, in which a base electrode has been formed by self alignment relative to an emitter electrode.

FIG. 7 shows a cross-sectional structure of a heterojunction bipolar transistor according to the second embodiment, in which a base electrode has been formed by self alignment relative to an emitter electrode.

As shown in FIG. 7, a subcollector layer 52 composed of $n^+$-type GaAs with a thickness of about 500 nm, a collector layer 53 composed of $n^-$-type GaAs with a thickness of about 500 nm, a base layer 54 composed of $p^+$-type GaAs with a thickness of about 70 nm, an emitter layer 55 composed of indium gallium phosphide (InGaP) with a thickness of about 50 nm, a first contact layer 56 as a first semiconductor layer composed of $n^+$-type GaAs with a thickness of about 100 nm, and a second contact layer 57 as a second semiconductor layer composed of $n^+$-type InGaAs with a thickness of about 100 nm and having an overhanging configuration which outwardly protrudes from the side surfaces of the first contact layer 56 are formed successively on a principal surface of a substrate 51 composed of semi-insulating GaAs.

A lower emitter electrode 58 composed of a Ti/Pt/Au multilayer structure is formed on the second contact layer 57 to have a contact area nearly equal to the contact area of the second contact layer 57.

On the region of the base layer 54 located externally of the emitter layer 55, a base electrode 59A is formed by self alignment relative to the lower emitter electrode 58 by utilizing the configuration of the second contact layer 57 which is overhanging from the first contact layer 56.

An upper emitter electrode 59B composed of the same multilayer structure as composing the base electrode 59A is formed on the lower emitter electrode 58. The lower and upper emitter electrodes 58 constitute an emitter electrode 60.

The emitter electrode 60 need not necessarily have a two-layer structure consisting of upper and lower layers. It is sufficient for the emitter electrode 60 to have either one of the upper and lower emitter electrodes 59B and 58. If consideration is given to the self-aligned formation of the base electrode 59A relative to the emitter electrode 60, however, a single-layer emitter electrode 60 is preferably composed of the upper emitter electrode 59B having the same composition as the base electrode 59A, as will be understood from the following description of the fabrication method.

For a reduction in ohmic resistance, the metal film in contact with the second contact layer 57 is composed of titanium. For easier formation of the so-called non-alloy lower emitter electrode 58 which is low in resistance and does not require a heat treatment for alloying, the n$^+$-type InGaAs is used as the material of the second contact layer 57.

A collector electrode 61 composed of the Ti/Pt/Au multilayer structure is formed on the peripheral portion of the top surface of the subcollector layer 52. An isolation region 62 composed of an insulating material is formed in the portion of the substrate 51 located externally of the collector electrode 61 and electrically insulated from other bipolar transistors (not shown) formed in the substrate 51. Instead of the Ti/Pt/Au multilayer structure, a multilayer structure consisting of a lower layer of nickel (Ni), gold (Au), and germanium (Ge) and an upper layer of gold (Au) (hereinafter referred to as a NiAuGe/Au multilayer structure) may also be used to compose the collector electrode 61.

A method of fabricating the bipolar transistor thus structured will be described with reference to the drawings.

FIGS. 8(a) to 8(c) through FIG. 10 illustrate the cross-sectional structures of the bipolar transistor according to the second embodiment in the individual process steps of the fabrication method therefor.

Figure 8A:
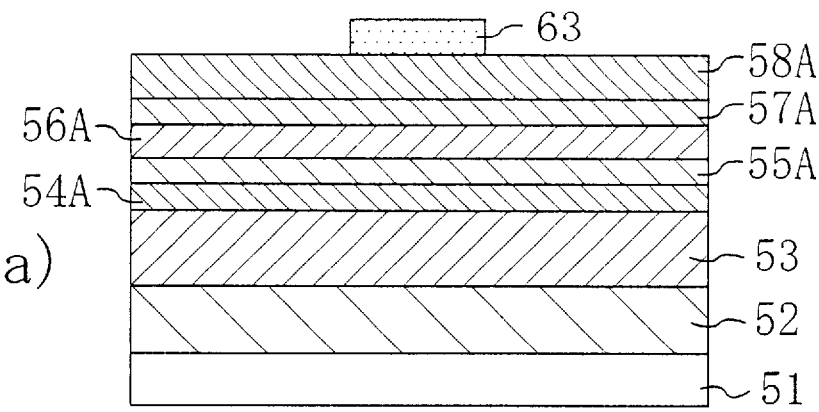
FIGS. 8(a) to 8(c) are structural cross-sectional views illustrating the process steps of a method of fabricating the bipolar transistor according to the second embodiment.

First, as shown in FIG. 8(a), the subcollector layer 52 composed of n$^+$-type GaAs with a thickness of about 500 nm, the collector layer 53 composed of n$^+$-type GaAs with a thickness of about 500 nm, a base-layer forming layer 54A composed of p$^+$-type GaAs with a thickness of about 70 nm, an emitter-layer forming layer 55A composed of InGaP with a thickness of about 50 nm, a first semiconductor layer 56A composed of n$^+$-type GaAs with a thickness of about 100 nm, and a second semiconductor layer 57A composed of n$^+$-type InGaAs with a thickness of about 100 nm are grown successively on the substrate 51 composed of semi-insulating GaAs. Thereafter, a first metal layer 58A composed of the Ti/Pt/Au multilayer structure is formed on the second semiconductor layer 57A by, e.g., EB vapor deposition. Subsequently, a resist pattern 63 in an island configuration having a pattern for forming the emitter electrode is formed by photolithography on the first metal layer 58A formed.

Figure 8B:
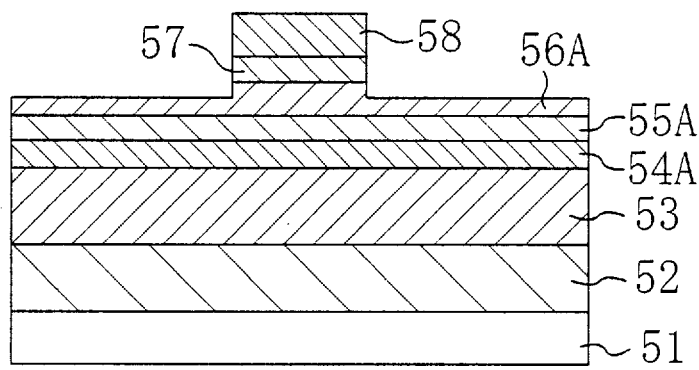

Next, etching is performed with respect to the first metal layer 58A and the second semiconductor layer 57A by using an ion milling process and the resist pattern 63 as a mask, thereby forming the lower emitter electrode 58 from the first metal layer 58A and forming the second contact layer 57 from the second semiconductor layer 57A, as shown in FIG. 8(b). Preferably, the ion milling process is completed at the time at which the upper portion of the first semiconductor layer 56A has been etched to a depth of about several tens of nanometers.

Figure 8C:
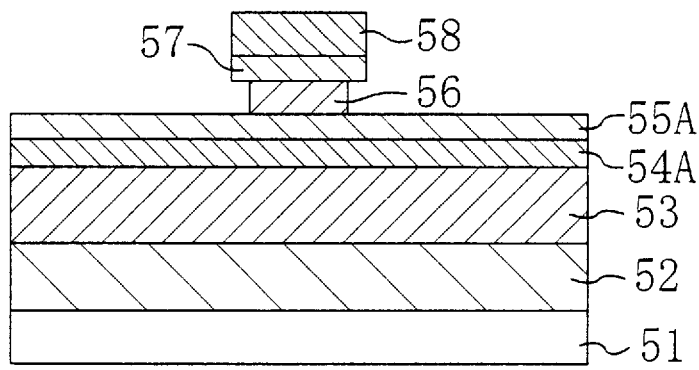

Next, as shown in FIG. 8(c), isotropic selective wet etching is performed with respect to the first semiconductor layer 56A by using a solution having an etching selectivity between the emitter-layer forming layer 55A and the first semiconductor layer 56A and the second contact layer 57 and capable of etching the first semiconductor layer 56A, such as a solution mixture of sodium citrate, aqueous hydrogen peroxide, and water, thereby forming, from the first semiconductor layer 56A, the first contact layer 56 forming a heterojunction with the emitter-layer forming layer 55A. As a result of the isotropic wet etching, the side surfaces of the first contact layers 56 have undercut configurations relative to the side surfaces of the second contact layer 57.

In the etching step involving ion milling and wet etching, a two-stage etching process consisting of anisotropic and isotropic etching steps is preferably performed by selective dry etching in accordance with an ICP method, similarly to the first embodiment. This enables control over the lateral dimension of the undercut configuration of the first contact layer 56 from each of the side surfaces of the second contact layer 57.

Figure 9A:
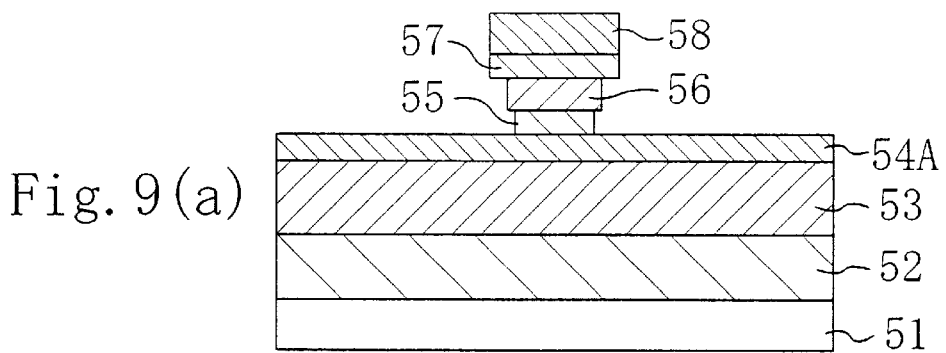
FIGS. 9(a) to 9(c) are structural cross-sectional views illustrating the process steps of the method of fabricating the bipolar transistor according to the second embodiment.

Next, as shown in FIG. 9(a), isotropic selective wet etching is performed by using a solution capable of selectively etching the emitter-layer forming layer 55A to the lower emitter electrode 58, the second contact layer 57, the first contact layer 56, and the base-layer forming layer 54A, such as a solution mixture of, e.g., hydrochloric acid, phosphoric acid, and water, thereby forming, from the emitter-layer forming layer 55A, the emitter layer 55 having an undercut configuration relative to each of the side surfaces of the first contact layer 56.

Figure 9B:
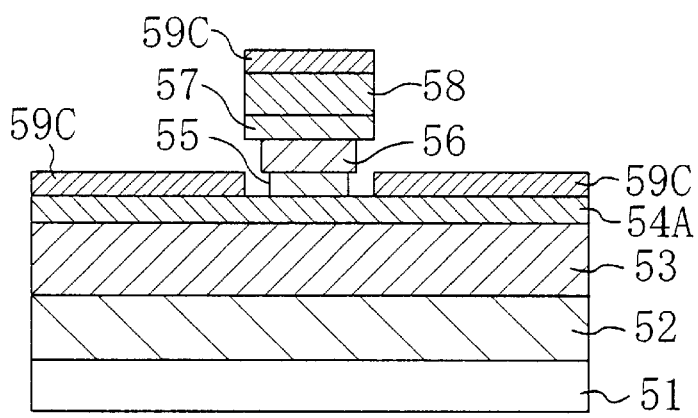

Next, as shown in FIG. 9(b), a second metal layer 59C composed of the Ti/Pt/Au multilayer structure for forming the base electrode is vapor deposited over the entire surface of the base-layer forming layer 54A including the lower emitter electrode 58. As a result, the side surfaces of the second metal layer 59C closer to the emitter layer 55 are formed by self alignment relative to the lower emitter electrode 58.

Figure 9C:
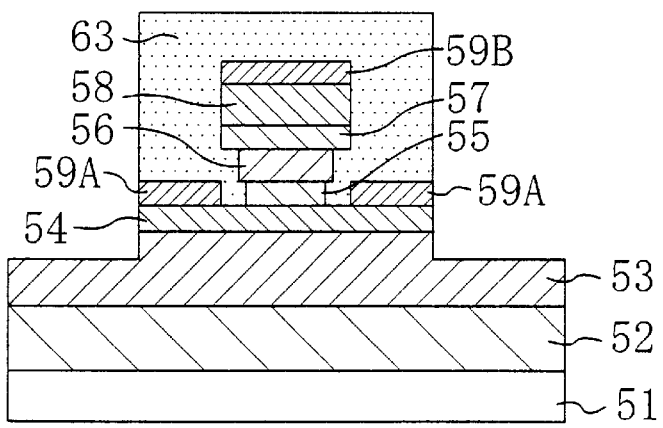

Next, as shown in FIG. 9(c), a resist pattern 63 for masking the emitter layer 55 and the peripheral region of the emitter layer 55 is formed on the second metal layer 59C. Ion milling is performed with respect to the second metal layer 59C and the base-layer forming layer 54A by using the formed resist pattern 63 as a mask, thereby removing the upper peripheral portion of the collector layer 53. Thereafter, boron ions or oxygen ions are implanted into the substrate 51, whereby the isolation region (not shown) is formed. Instead of ion implantation, mesa etching may also be performed with respect to the isolation region as a method of forming the isolation region.

Figure 10:
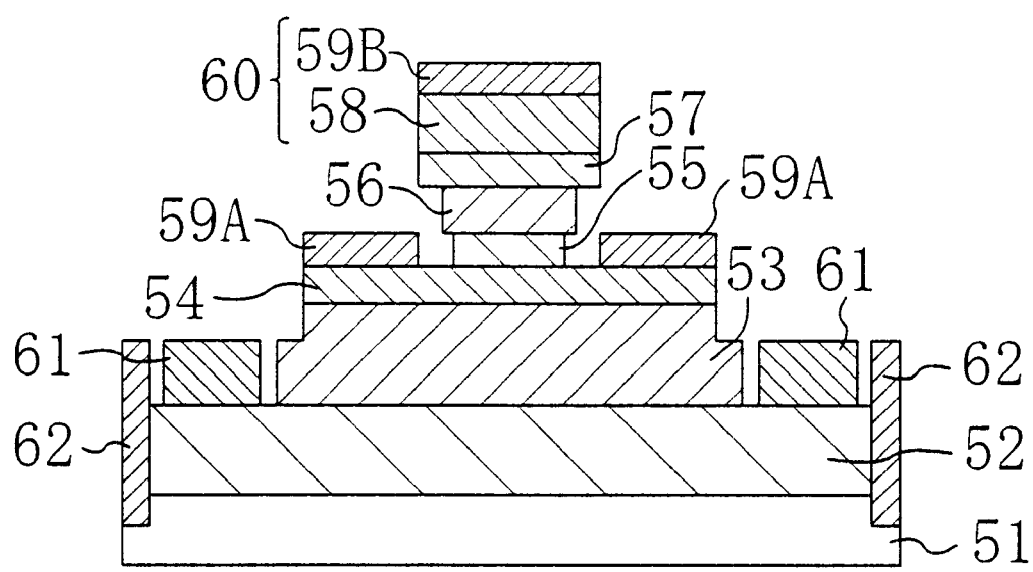
FIG. 10 is a structural cross-sectional view illustrating the process step of the method of fabricating the bipolar transistor according to the second embodiment.
Figure 11:
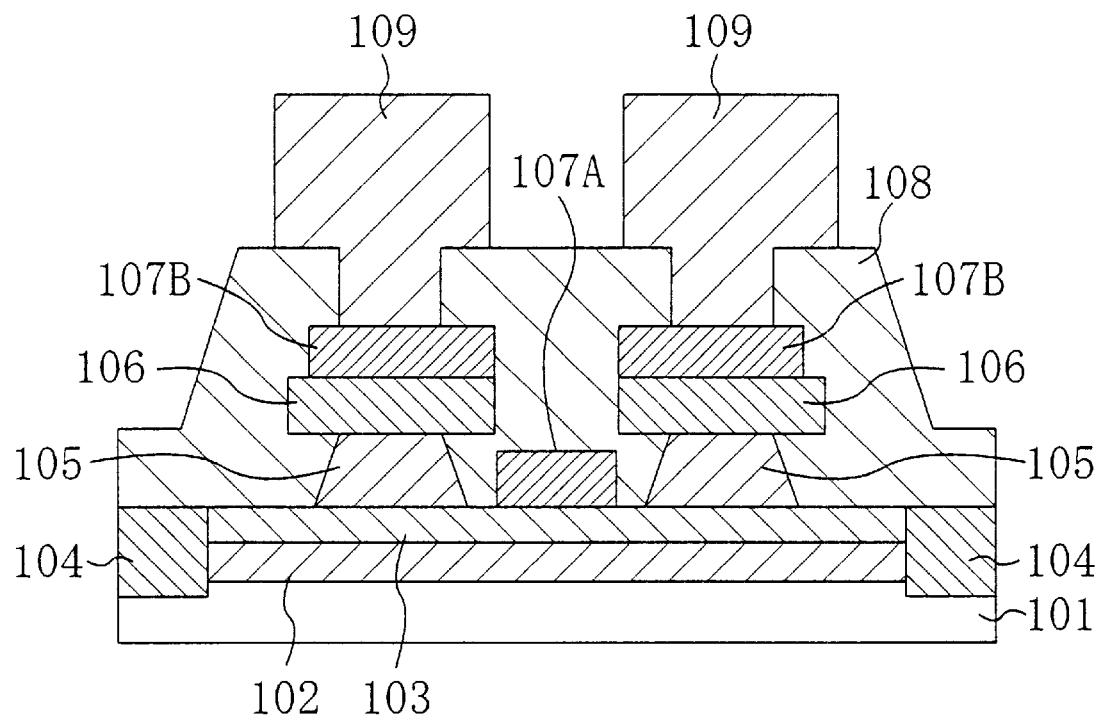
FIG. 11 is a structural cross-sectional view in the direction of the gate length of a conventional heterojunction field-effect transistor, in which a gate electrode has been formed by self alignment relative to ohmic electrodes.

Next, as shown in FIG. 10, wet etching using a solution mixture of phosphoric acid, aqueous hydrogen peroxide, and water is performed selectively with respect to the peripheral portion of the collector 53, thereby exposing the subcollector layer 52 to form the collector electrode 61 composed of the Ti/Pt/Au multilayer structure or NiAuGe/Au multilayer structure.

Even if the first metal layer 58A is not vapor deposited on the second semiconductor layer 57A in the film forming step shown in FIG. 8(a), the bipolar transistor according to the present embodiment can be formed. This allows the base electrode 59A and the emitter electrode 60 to be formed from the second metal layer 59C as a single layer so that the fabrication process steps are reduced.

By forming the emitter electrode 60 having a two-layer structure in the second embodiment, the thickness of the emitter electrode 60 is no more restricted by the thickness of the base electrode 59A, which achieves a further reduction in the resistance of the emitter electrode 60.

Thus, according to the second embodiment, the second contact layer 57 composed of InGaAs and formed to protrude from the side surfaces of the first contact layer 56 and have a contact area nearly equal to the contact area of the lower emitter electrode 58 is disposed between the first contact layers 56 composed of GaAs and the lower emitter electrode 58 composed of the Ti/Pt/Au multilayer structure. This achieves a sufficient reduction in the contact resistance between the lower emitter electrode 58 and the second contact layer 57.

When the first contact layer 56 is etched selectively in the wet etching step shown in FIG. 8(c), moreover, the interface between the second contact layer 57 and the first contact layer 56, which is the interface between the semiconductor layers, is prevented from being etched into a wedge-shaped configuration.

The discontinuity between the energy level in the lower end portion of the conduction band of the first semiconductor layer 56A composed of GaAs and that of the second semiconductor layer 57A composed of InGaAs can be reduced by adjusting the composition of In in the portion of the second semiconductor layer 57A closer to the interface with the first semiconductor layer 56A to be lower than the portion thereof closer to the interface with the first metal layer 58A.

What is claimed is:

1. A field-effect transistor comprising:
   a substrate having a channel layer;
   first semiconductor layers disposed in at least two regions located above the channel layer and spaced apart in a direction parallel to a substrate surface;
   second semiconductor layers disposed on the respective first semiconductor layers to protrude from respective side surfaces of the first semiconductor layers;
   ohmic electrodes disposed on the respective second semiconductor layers; and
   a gate electrode disposed in a region located above the channel region and lying between the first semiconductor layers in spaced relation to the side surfaces of the first semiconductor layers,
   wherein a top surface of the gate electrode is lower than a top surface of the first semiconductor layers.

2. The field-effect transistor of claim 1, wherein each of the first semiconductor layers is composed of gallium arsenide and each of the second semiconductor layers is composed of indium gallium arsenide.

3. The field-effect transistor of claim 1, wherein each of the ohmic electrodes is composed of a multilayer structure including a plurality of metal layers, of which the metal layer closer to the substrate contains titanium.

4. A bipolar transistor comprising:
   a collector layer disposed above a substrate;
   a base layer disposed on the collector layer;
   a first semiconductor layer disposed above the base layer and a base electrode disposed in spaced relation to the first semiconductor layer;
   a second semiconductor layer disposed on the first semiconductor layer to protrude from side surfaces of the first semiconductor layer; and
   an emitter electrode disposed on the second semiconductor layer,
   wherein the first semiconductor layer consists of gallium arsenide and the second semiconductor layer comprises indium gallium arsenide.

5. A bipolar transistor comprising:
   a collector layer disposed above a substrate;
   a base layer disposed on the collector layer;
   a first semiconductor layer disposed above the base layer and a base electrode disposed in spaced relation to the first semiconductor layer;
   a second semiconductor layer disposed on the first semiconductor layer to protrude from side surfaces of the first semiconductor layer; and
   an emitter electrode on the second semiconductor layer,
   wherein the emitter electrode is composed of a multilayer structure including a plurality of metal layers, of which the metal layer closer to the substrate contains titanium.

6. A field-effect transistor comprising:
   a substrate having a channel layer;
   first semiconductor layers disposed in at least two regions located above the channel layer and spaced apart in a direction parallel to a substrate surface;
   second semiconductor layers disposed on the respective first semiconductor layers to protrude from respective side surfaces of the first semiconductor layers;
   ohmic electrodes disposed on the respective second semiconductor layers; and
   a gate electrode disposed in a region located above the channel region and lying between the first semiconductor layers in spaced relation to the side surfaces of the first semiconductor layers;
   wherein each of the first semiconductor layers is composed of gallium arsenide and each of the second semiconductor layers is composed of indium gallium arsenide.

7. A field-effect transistor comprising:
   a substrate having a channel layer;
   first semiconductor layers disposed in at least two regions located above the channel layer and spaced apart in a direction parallel to a substrate surface;
   second semiconductor layers disposed on the respective first semiconductor layers to protrude from respective side surfaces of the first semiconductor layers;
   ohmic electrodes disposed on the respective second semiconductor layers; and a gate electrode disposed in a region located above the channel region and lying between the first semiconductor layers in spaced relation to the side surfaces of the first semiconductor layers;

wherein each of the ohmic electrodes is composed of a multilayer structure including a plurality of metal layers, of which the metal layer closer to the substrate contains titanium.

8. A bipolar transistor comprising:

a collector layer disposed above a substrate;

a base layer disposed on the collector layer;

a first semiconductor layer disposed above the base layer and a base electrode disposed in spaced relation to the first semiconductor layer;

a second semiconductor layer disposed on the first semiconductor layer to protrude step-like from side surfaces of the first semiconductor layer; and an emitter electrode disposed on the second semiconductor layer, an area where the emitter electrode faces the second semiconductor layer is substantially equal to an area of the second semiconductor layer, wherein the first semiconductor layer comprises gallium arsenide and the second semiconductor layer comprises indium gallium arsenide;

wherein the first and second semiconductor layers are comprised of different materials.

* * * * *